United States Patent [19]

Sugimoto et al.

[11] Patent Number: 4,965,245

[45] Date of Patent: Oct. 23, 1990

[54] METHOD OF PRODUCING OXIDE SUPERCONDUCTING CABLES AND COILS USING COPPER ALLOY FILAMENT PRECURSORS

[75] Inventors: Masaru Sugimoto; Osamu Kohno; Yoshimitsu Ikeno; Nobuyuki Sadakata; Mikio Nakagawa; Shin'ya Aoki; Masayuki Tan; Ryuichi Okiai; Syotaro Yoshida; Masakazu Hasegawa; Hiroshi Yamanouchi, all of Tokyo, Japan

[73] Assignee: Fujikura Ltd., Tokyo, Japan

[21] Appl. No.: 219,433

[22] Filed: Jul. 15, 1988

[30] Foreign Application Priority Data

Jul. 17, 1987 [JP]  Japan .................... 62-178352
Jul. 24, 1987 [JP]  Japan .................... 62-184903
Aug. 8, 1987 [JP]  Japan .................... 62-198913

[51] Int. Cl.$^5$ ............................................ H01L 39/24
[52] U.S. Cl. ........................................ 505/1; 505/740; 505/704; 29/599; 148/277; 148/282; 427/62; 174/125.1
[58] Field of Search ............... 427/62; 29/599; 505/1, 505/740, 704; 148/277, 282; 174/125.1

[56] References Cited

U.S. PATENT DOCUMENTS

| | | | |
|---|---|---|---|
| 3,905,839 | 9/1975 | Hashimoto | 29/599 |
| 4,757,161 | 7/1988 | Wilhelm et al. | 29/599 |
| 4,885,273 | 12/1989 | Sugimoto et al. | 505/1 |

OTHER PUBLICATIONS

Materials Research Society Symposium Proceedings, vol. 99, (1988), pp. 293-296, "Fabrication and Superconducting Properties of High Tc Oxide Wire", N. Sadakata et al.

Material Research Society International Symposium Proceedings, Superconductivity, vol. 6, (1989), pp. 169-173, "Characterization and Superconducting Properties of Y–Ba–Cu–O Wire," Y. Ikeno et al.

Physica B 155 (1989), pp. 164-166, "High Field Properties and Characteristics of Oxide Superconductors", Yoshimitsu Ikenu et al.

Physica 148B (1987), pp. 429-431, "Characteristics of High-T$_c$ Oxide Wire", O. Kohno et al.

(List continued on next page.)

*Primary Examiner*—Norman Morgenstern
*Assistant Examiner*—Roy V. King
*Attorney, Agent, or Firm*—Oblon, Spivak, McClelland, Maier & Neustadt

[57] ABSTRACT

A method of producing a superconducting cable or a coil including an A-B-C-D system superconductor where the A includes an element of group IIIa of the Periodic Table, the B an element of group IIa of the Periodic Table, C copper, D oxygen. A plurality of filaments are selected from a copper alloy filament including: a copper alloy filament including the A element; copper alloy filament including the B element; a copper alloy filament including both the elements the A and the B; a first metallic filament having particles of a copper oxide, copper halide or copper sulfide dispersed therein; a second metallic filament coated with an oxide layer; a copper filament containing the A element and having particles of a copper oxide, copper halide or copper sulfide dispersed therein; a copper filament containing the B element and having particles of a copper oxide, copper halide or copper sulfide dispersed therein; a third metallic filament containing the A element and coated with an oxide layer; a fourth metallic filament containing the B element and coated with an oxide layer; the first to fourth metallic filaments being substantially free of any component which provides an adverse effect on the production of the superconductor. The selected filaments are arranged to form element filaments bundle so that the superconductor is produced in a subsequent heat treatment. The bundle is drawn and then heated under an oxidizing atmosphere for producing the superconductor.

13 Claims, 4 Drawing Sheets

OTHER PUBLICATIONS

Japanese Journal of Applied Physics, vol. 27, No. 1 (1988), pp. L77-79, "High Critical Current Density . . . ", O. Kohno et al.

Japanese Journal of Applied Physics, vol. 26, No. 10 (1987), pp. 1653-1656, "Critical Current Density . . . ", O. Kohno et al.

Advanced Ceramics Materials, vol. 2, No. 3B, Special Issue 1987, pp. 388-400, "Problems in the Production of $YBa_2Cu_3O_x$ Superconducting Wire", R. W. McCallum et al.

Commission of the European Community, Proceedings of the Workshop on High $T_c$ Superconductors and Potential Applications, (1987), pp. 133-135, First Characterizations of High $T_c$ Superconducting Oxide . . . , P. Dubots et al.

Kumakura et al., "$B_a$—Y—Cu—O Superconducting Tape Prepared by Surface Diffusion Process", Jpn. J. Appl. Phys. 26(7) Jul. 1987, L1172-1173.

Tachikawa et al., "Preparation of Y—$B_2$—Cu Oxide Superconducting Composite Tapes by a Diffusion Process", MRS vol. 99, Nov. 1987, p. 727-730.

Masumoto et al., "Asahi Newspaper", Mar. 10, 1987.

Glowacki et al., "External and Internal Diffusion of Oxygen in Superconducting $YBa_2Cu_3O_7$ Composite Conductors", MRS vol. 99, Nov. 1987, pp. 741-744.

Kohno et al., "Critical Temperature and Critical Current Density of La—Sr—Cu Oxide Wires", Jpn. J. Appl. Phys. 26 (5), May 1987, L759-760.

McCallum et al., "Problems in the Production of $YBa_2Cu_3O_x$ Superconducting Wire", Adv. Cer. Mat., vol. 2 (3B), Jul. 1987, p. 388-390.

Jin et al., "High Tc Superconductors-Composite Wire Fabrication", Appl. Phys. Lett. 51 (3), Jul. 1987, pp. 203-204.

Ohmatsu et al., "Superconducting Wires of High Tc Oxides", Jpn. J. Appl. Phys. 26 (1987), Suppl. 26-3.

METHOD OF PRODUCING OXIDE SUPERCONDUCTING CABLES AND COILS USING COPPER ALLOY FILAMENT PRECURSORS

BACKGROUND OF THE INVENTION

The present invention relates to a method of producing a superconducting wire including an oxide superconductor. The superconducting wire may be used for magnet coils of, for example, the nuclear magnetic resonance imaging apparatus and the particle accelerator. In this specification and claims, the term "superconducting wire" means a superconducting wire, cable, braid, tape and a superconducting piece of a similar configuration. Some of the Inventors proposed oxide superconductors in the following applications as joint inventors: U.S. patent application Ser. No. 7/170,019 filed Mar. 18, 1988 entitled "Method of producing a superconducting wire using alloy preform", now U.S. Pat. No. 4,885,273, U.S. patent application Ser. No. 7/170,018 filed on Mar. 18, 1988 entitled "Method of producing oxide superconducting wire and oxide superconducting wire produced by this method"; U.S. patent application Ser. No. 7/191,436 filed on May 9, 1988 entitled "Superconductive electric wire and method for making it"; and U.S. patent application Ser. No. 07/178,223 filed on Apr. 6, 1988 entitled "Oxide superconductor and manufacturing method thereof" The disclosure of each of these four U.S. patent applications is incorporated herein by reference.

Recently, various oxide superconductors have been discovered which show very high values of the critical temperatures (Tc) at which the transition from a normal conductive state to a superconductive state takes place. Since such an oxide superconductor shows much higher critical temperature than conventional alloy or intermetallic compound superconductors, it is considered that oxide superconductors will highly promise for practical superconducting materials.

For producing cables having such an oxide superconductor, the following typical production methods have been proposed. In one method, material powders of the oxide superconductor were mixed at a predetermined ratio to prepare a mixed powder, which is then charged into a metallic pipe, which is in turn reduced in diameter and then heat treated to produce the superconductor. In another method, the mixed powder is compression molded to form a green compact, which is heat treated to produce a superconducting sinter. The sinter is pulverized into a powder, which is charged into a metallic sheath, which is reduced in diameter together with the charged powder and is then subjected to heat treatment to produce a superconducting wire.

These methods are disadvantageous in that it is difficult to produce long superconducting wires or cables with excellent superconductivity. The reason is that it is rather hard to completely uniformly mix superconductor material powders with the result in that it is difficult to obtain a homogeneous crystal structure of the superconductor along the entire length of the cable. Another disadvantage is that it is rather difficult to control the composition of superconductors. Still another disadvantage is that the oxide superconductor is a ceramic and is hence inferior in mechanical strength to other conventional superconductors.

Accordingly, it is an object of the present invention to provide a method of producing a superconducting wire including an oxide superconductor, in which method the superconductor is easily controlled to have a predetermined composition with both excellent superconductivity and high mechanical strength.

SUMMARY OF THE INVENTION

One aspect of the present invention is directed to a method of producing a superconducting wire including an A-B-C-D system superconductor where the A includes an element of group IIIa of the Periodic Table, the B an element of group IIa of the Periodic Table, C copper, D oxygen. A plurality of filaments is selected from a copper alloy filament including: the A element, a copper alloy filament including the B element; a copper alloy filament including both the elements the A and the B; a first metallic filament having particles of a copper oxide, copper halide or copper sulfide dispersed therein; a second metallic filament coated with an oxide layer; a copper filament containing the A element and having particles of a copper oxide, copper halide or copper sulfide dispersed therein; a copper filament containing the B element and having particles of a copper oxide, copper halide or copper sulfide dispersed therein; a third metallic filament containing the A element and coated with an oxide layer; a fourth metallic filament containing the B element and coated with an oxide layer; the first to fourth metallic filaments being substantially free of any component which provides an adverse effect on the production of the superconductor. The selected filaments are arranged for forming a superconductor element filaments bundle so that the superconductor is produced in a subsequent heat treatment. The bundle is drawn and then heated for producing the superconductor.

In another aspect of the present invention, the filaments selected in the selecting step are placed in a groove, formed in one face of a metallic disc, for forming a superconductor element filament bundle so that the superconductor is produced in a subsequent heat treatment. The disc with the superconductor element filament bundle is rolled for jointing together and then the rolled superconductor element filament bundle is heated for producing the superconductor.

The IIa group element includes Be, Sr, Mg, Ca, Ba and Ra.

The IIIa group element includes Sc, Y, La, Ce, Pr, Nd, Pm, Sm, Eu, Gd, Tb, Dy, Ho, Er, Tm, Yb and Lu.

The oxide superconductor of the present invention may be typically expressed by the following formula:

$$A_xB_yCu_zO_{9-\delta}$$

wherein x, y, z and $\delta$ are typically within the range of $0.1 \leq x \leq 2.0$, $1 \leq y \leq 3$, $1 \leq z \leq 3$, and $0 \leq \delta \leq 7$, respectively. In a Y-Ba-Cu-O system, it is preferably an orthorhombic system and it is typically that $x=1$, $y=2$, $z=3$, and $2<\delta<3$, preferably $\delta=$about 2. In a $(La_{2-x}M_x)CuO_4$ system, typically $0<x<0.3$ and preferably $x=0.15$ wherein M may include Be, Sr, Mg, Ca, Ba or Ra.

In the present invention, the heat treatment is carried out typically at about 700° to about 1100° C., preferably about 800° to about 1000° C. and typically for about 1 to about 300 hours, preferably about 1 to about 100 hours.

The component A may include more than two IIIa group elements above named while the component B may include more than two IIa group elements above named. When two elements are used for either the A or the B, for example, La-Yb-Ba-Cu-O or Y-Ba-Sr-Cu-O system superconductor is produced.

BRIEF DESCRIPTION OF THE INVENTION

In the drawings, in which the same reference characters designate like parts throughout views.

DETAILED DESCRIPTION OF THE PREFERRED EMBODIMENTS

Figure 1A:
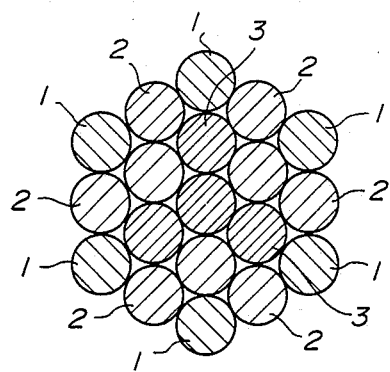
FIG. 1A is a cross-sectional view of a filament bundle in one embodiment of the present invention.
Figure 1B:
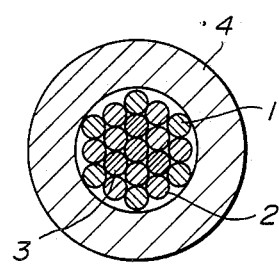
FIG. 1B is a cross-sectional view with a modified scale of a bundle assembly using the filament bundle in FIG. 1A.

FIGS. 1A and 1B illustrate one embodiment of the present invention which is applied to an Y-Ba-Cu oxide wire. In this production method, six Y-Cu alloy filaments 1, nine Ba-Cu alloy filaments 2 and four Cu filament 3 having fine particles of an copper oxide, such as CuO, $Cu_2O$, $Cu_2O_3$, $Cu_4O$, are bundled together in an illustrated arrangement to form a bundle, which is inserted into a Y-Cu alloy pipe 4 as in FIG. 1B to produce a bundle assembly. The arrangement of the filaments 1–3 is not limited to the arrangement in FIG. 1A but they are arranged adjacent to each other to produce the oxide superconductor. The assembly is reduced in diameter and then is subjected to heat treatment typically at about 700° to about 1100° C., preferably about 800° to about 1000° C. for about 1 to about 300 hours, preferably about 1 to about 100 hours to produce the superconductor.

Each Y-Cu alloy filament 1 may contain about 5 wt. % to about 50 wt. % of yttrium. Each of Ba-Cu alloy filaments 2 may include about 5 wt. % to about 50 wt. % of barium. The Y-Cu alloy pipe 4 may contain about 5 wt. % to about 50 wt. % of yttrium.

Copper filaments 3 may each contain about 10 wt. % to about 40 wt. % of copper oxide particles having a grain size of about 0.1 to 10 μm.

In place of copper filaments 3 having fine oxide copper particles, metallic filaments or wires, each having an oxide layer formed on its surface by anodizing or chemical conversion coating, may be used, the oxide layer containing a sufficient amount of oxygen to produce a specific superconductor. Fine copper particles may be dispersed in Y-Cu alloy filaments 1 and Ba-Cu alloy filaments 2 at an amount sufficient for production of an oxide superconductor. In this case, copper filament 3 may be omitted. A copper halide, such as CuF, CuCl, $CuF_2$ and $CuCl_2$, may be dispersed in the filament 1, 2 and 3 and the pipe 4.

The Y-Cu alloy pipe 4, having filament bundle placed in it as in FIG. 1B, may be covered with a barrier layer (not shown) such as of Ni and Ti, and then with a stabilizing tube (not shown) made of, for example, oxygen free copper, and then is subjected to the wire drawing to reduce into a desired diameter, followed by the heat treatment to produce the superconductor.

Figure 2:
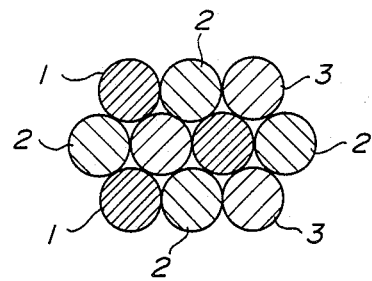
FIG. 2 is a cross-section of another filament bundle in another embodiment of the present invention.
Figure 3:
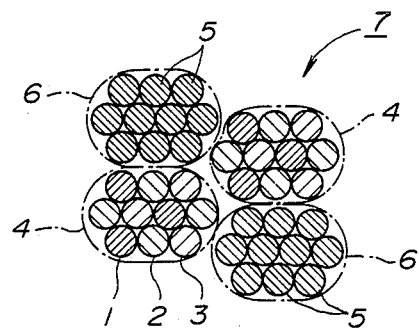
FIG. 3 is a cross-section of a bundle assembly using the filament bundle in FIG. 2.
Figure 4:
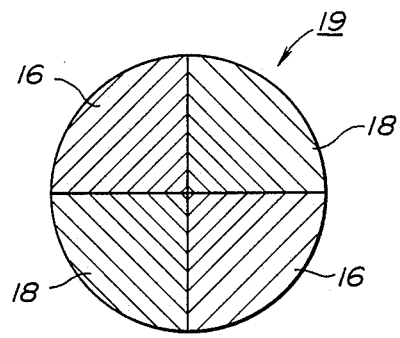
FIG. 4 is a cross-section of a finished superconducting cable using the bundle assembly in FIG. 3.

FIGS. 2 to 4 illustrate another embodiment of the present invention, in which three Y-Cu alloy filaments 1, four Ba-Cu alloy filaments 2 and three copper filaments 3 are bundled to form a superconductor element filament bundle 4. Two superconductor element filament bundles 4 and 4 thus prepared and two normal conductor filament bundles 6 and 6, each of which has ten copper filaments 5 bundled, are assembled in parallel to each other as illustrated in FIG. 3 to form a bundle assembly 7, which is then shaped and reduced in diameter to form a round cable 19 having two superconductor element segments 18 and 18 and normal conductor segments 16 and 16, each segment 16, 16, 18, 18 having a sector cross-section. The cable 19 is subjected to heat treatment preferably at about 800° to about 1000° C. for about 1 to about 100 hours.

With the heat treatment, a reaction occurs at portions of Y-Cu alloy filaments 1, Ba-Cu alloy filaments 2 and CuO dispersed copper filaments 3, which portions are in contact with each other, to form an Y-Ba-Cu oxide superconductor with a uniform crystal structure continuously along the entire length of the cable 19. Unreacted metallic portions of the segments 16, 16, 18 and 18 of the superconducting cable 19 reinforce the latter.

The number of each of superconductor element filament bundles 4 and normal conductor bundles 6 is not limited to the number shown and described. It is preferable to arrange bundles 4 and 6 to be adjacent to each other as in FIG. 3.

For producing a superconductor of another system, conditions of heat treatment should be appropriately varied.

The superconducting cable 19 does not necessarily have a circular shape in cross-section but may have other configurations such as a rectangular shape.

The bundle assembly 7 may be inserted in a metallic sheath, for example the sheath 4 as previously described, and then subjected to the diameter reduction after which it undergoes the heat treatment for producing the superconductor.

The normal conductor filament bundles 6 and 6 may be replaced by integral segments each having a sector-shaped cross-section. The normal conductor filaments 5 and 5 may be made of silver, gold, platinum, aluminum, a copper alloy, silver alloy, stainless steel, copper-silver clad, copper-gold clad and other conventional metallic materials.

A stabilizing layer may be formed over the cable in the manner as previously described in connection with the first embodiment.

Figure 5:
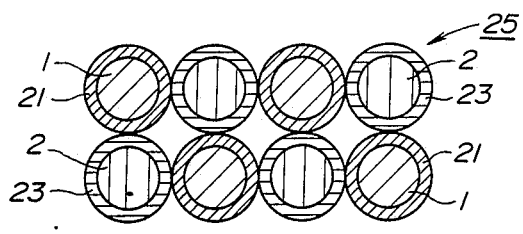
FIG. 5 is a cross-section of a filament bundle in still another embodiment of the present invention.
Figure 6:
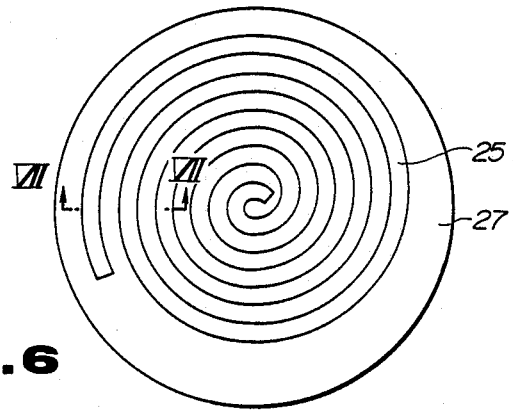
FIG. 6 is an enlarged plan view of a metallic disc with the filament bundle in FIG. 5.
Figure 7:
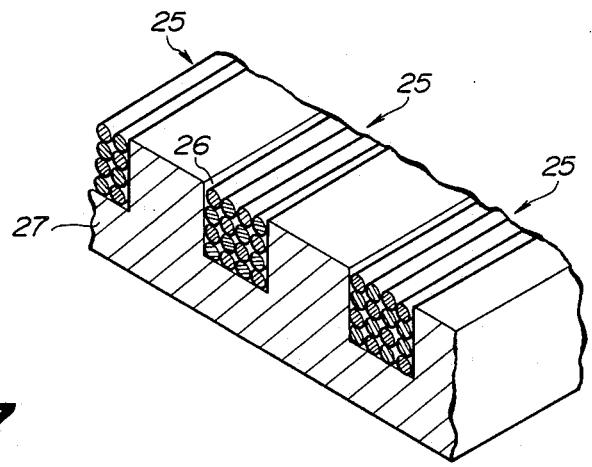
FIG. 7 is an enlarged perspective view of a section taken along the line VII—VII in FIG. 6.
Figure 8:
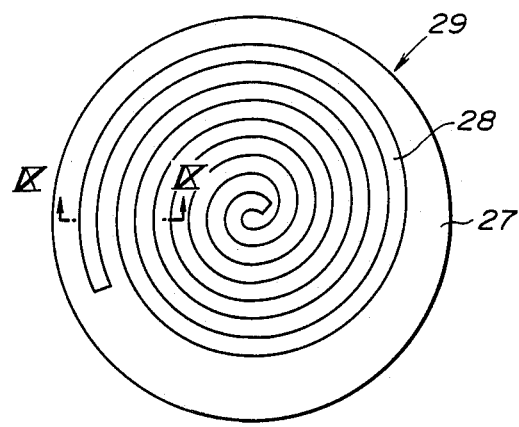
FIG. 8 is a plan view of the metallic disc in FIG. 6 after rolled and heat treated.
Figure 9:
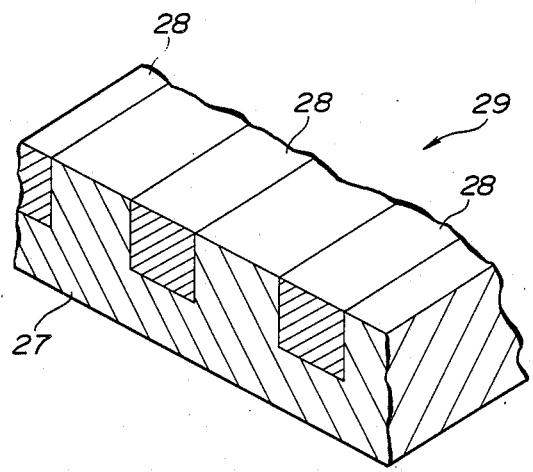
FIG. 9 is a perspective view of a section taken along the line IX—IX in FIG. 8.

FIGS. 5 to 9 illustrate a third embodiment of the present invention, in which eight Y-Cu alloy filaments 1, having an oxide layer 21 coated over it, and eight Ba-Cu alloy filaments 2, having another oxide layer 23 are prepared and bundled to form a filament bundle 25 although eight filaments 1 and 2 in total are shown in FIG. 5. It is preferable to arrange filaments 1 and 2 adjacent to each other as illustrated in FIG. 5 so that an oxide superconductor is efficiently produced. The number of filaments 1 and 2 coated with oxidized coatings is not limited to the number as illustrated. Each of the filaments 1 and 2 are formed by drawing an Y-Cu alloy rod or a Ba-Cu alloy rod to a predetermined diameter and then coated with the oxidized film 21 and 23. Such oxidized films 21 and 23 may be formed by heating the drawing filaments in an oxidizing atmosphere of pure oxygen. Alternatively, they may be made by anodizing the drawn filaments in an electrolytic bath consisting of a water solution of an hydroxide of an alkali metal, such as NaOH and KOH, or an alkaline earth metal such as $Ba(OH)_2$.

For providing oxygen to filaments 1 and 2, a copper oxide may be dispersed in them as in filaments 3 in FIG. 1A without the forming of oxidized coatings 21 and 23.

Then, the filament bundle 25 is placed within a spiral groove 26 formed in one face of a metallic disc 27 (FIGS. 6 and 7), which is subsequently rolled to a predetermined thickness and for jointing the filament bundle 25 and the disc 27 together. Such rolling may be carried out by a conventional rolling mill. It is preferable that the disc 27 and the bundle 25 are integrally jointed with little void.

The disc 27 may be made of copper, silver, gold, platinum, a copper alloy, silver alloy, copper-silver clad, copper-gold clad or like metallic material. Silver is preferable for the disc 27.

The rolled disc 27 may be heated in the same conditions as in the preceding embodiment. It is preferable that such a heat treatment is carried out in an oxidizing atmosphere which contains an oxygen mixture gas including both oxygen gas and an inactive gas, such as argon gas, or having oxygen gas mixed with a halogen gas such as chlorine gas and fluorine gas.

This heat treatment causes heat diffusion reaction to occur at contact portions of Y-Cu alloy filaments 1 and Ba-Cu alloy filaments 2 where Y-Ba-Cu-O system superconductor having a uniform crystal structure is produced along the entire length of the filament bundle 25, thus the latter becoming a spiral superconducting cable 28. With such a procedure, a superconducting coil 29 having a spiral superconducting wire 28, which conducts electric current, is formed.

In the preceding embodiments, the number of the filaments 1, 2 and 3 is not restricted to the number illustrated in drawings.

EXAMPLE 1

A copper rod containing 5 wt. % of yttrium and having 20 mm diameter, a copper rod containing 5 wt. % of barium and having 20 mm diameter, and a copper rod containing 10 wt. % of copper oxide particles dispersed and having a 20 mm diameter were reduced in diameter to form six Y-Cu filaments, nine Ba-Cu filaments and four copper oxide particles dispersed copper filaments respectively, each filament having 1 mm diameter. These reduced diameter filaments were bundled in an arrangement, as illustrated in FIG. 1A, and then placed within a copper alloy pipe containing 5 wt. % yttrium having 4 mm inner diameter and 8 mm outer diameter to form a bundle assembly, which was reduced in diameter to have 0.5 mm outer diameter. Subsequently, the reduced diameter bundle assembly was heat treated at 900° C. for 20 hours to produce a superconducting cable, which was a long cable with an improved mechanical strength, having 95K critical temperature.

EXAMPLE 2

15% yttrium containing Y-Cu alloy filaments, 30% Ba containing Ba-Cu alloy filaments and 45% CuO dispersed copper filaments, each filament having 1 mm diameter, were prepared and arranged as in FIG. 2 to form two superconductor element filament bundles. Two normal conductor filament bundles, each including 1 mm diameter copper filaments bundled as in the superconductor filament bundles, were also prepared and were assembled with the two superconductor filament bundles, as in FIG. 3, to form a bundle assembly, which was then reduced in diameter to obtain a cable having an outer diameter 0.5 mm, which was heat treated at 500°–900° C. for 10–20 hours to produce a long superconducting cable having the same structure as the superconductor cable in FIG. 4. The superconducting cable thus produced exhibited an excellent superconducting performance of a critical temperature fo 95K with enhanced mechanical strength.

EXAMPLE 3

A copper alloy rod, containing 10% of yttrium, and a copper alloy rod, containing 10% of barium, were reduced in diameter to obtain an Y-Cu alloy filament and a Ba-Cu alloy filament respectively, each filament having a 0.2 mm diameter. These filaments were subjected to anodizing treatment at current density of 20 $mA/cm^2$ for 10 minutes by using an electrolytic bath containing 20% NaOH water solution as the treating liquid to form oxide films over them, respectively. Five Y-Cu alloy filaments and ten Ba-Cu alloy filaments, both filaments being thus coated with oxide films, were braided to obtain a braided tape 0.5 mm thick and 1.7 mm wide, which was then placed in a spiral groove, formed in one face of a silver disc having 50 mm diameter and 2.5 mm thickness, the groove being 2 mm wide and 1 mm deep with adjacent grooves interval 2 mm. The silver disc with the spirally deformed braided tape was rolled to a thickness of 1.5 mm, thereby jointing the tape to it, and then it was heat treated at a mixture gas atmosphere including oxygen gas and argon gas at 900° C. for 24 hours. With this heat treatment, a superconducting coil, having the same structure as the coil in FIG. 8, was produced. The superconductor coil had critical temperatures of 92 to 95K at portions of the superconducting cable 28. The coil disc and the superconductor cable embedded in it were in an excellent joint condition.

What is claimed is:

1. A method of producing a superconducting coil, comprising an A-B-C-D system superconductor, wherein A is one or more elements selected from the group consisting of Sr, Mg, Ca and Ba; B is one or more elements selected from the group consisting of Sc, Y, La, Ce, Pr, Nd, Pm, Sm, Eu, Gd, Tb, Dy, Ho, Er, Tm, Yb and Lu; C is copper and D is oxygen, which method comprises:
   (a) selecting a plurality of copper alloy filaments, such that a superconductor is formed upon subsequent heat treatment, from the group consisting of:
      (i) a copper alloy filament including at least one A element, and a copper alloy filament including at least one B element;
      (ii) a copper alloy filament including both elements A and B;
      (iii) a first copper alloy filament having particles of a copper oxide dispersed therein;

(iv) a second copper alloy filament coated with an oxide layer;

(v) a copper alloy filament containing at least one A element and having particles of a copper oxide dispersed therein;

(vi) a copper alloy filament containing at least one B element and having particles of a copper oxide dispersed therein;

(vii) a third copper alloy filament containing an A element and being coated with an oxide layer; and (viii) a fourth copper alloy filament containing a B element and being coated with an oxide layer; the first to fourth copper alloy filaments being substantially free of any component which adversely effects the production of the superconductor;

(b) arranging the selected filaments to form at least one filaments bundle;

(c) drawing at least one filaments bundle and then forming a bundle assembly; and (d) heating the drawn bundle assembly under an oxidizing atmosphere, thereby producing the superconductor, the filaments bundle having a substantially uniform crystal structure along the entire length thereof.

2. The method as recited in claim 1, wherein the arranging step (b) comprises the step of placing the selected filaments in a metallic receptacle to form the bundle and the drawing step (c) includes drawing the metallic receptacle together with the selected filaments.

3. The method as recited in claim 2, wherein the metallic receptacle is a metallic pipe.

4. The method as recited in claim 1, wherein the arranging step (b) comprises the step (e) of arranging normal conducing filaments to a normal conducting filaments bundle; further comprising the step (f) of assembling the normal conductor filament bundle and the supercoductor element filament bundle into a bundle assembly, whereby the bundle assembly is drawn in the drawing step (c) and is then heated in the heating step (d).

5. The method as recited in claim 4, wherein the assembling step (f) comprises the step of assembling more than two superconductor element filament bundles and more than two normal conductor filament bundles symmetrically about an axis.

6. The method as recited in claim 1, wherein said A-B-C-D system superconductor has the formula:

$(La_{2-x}M_x)CuO_4$ wherein $0<x<0.3$, and M is selected from the group consisting of Sr, Mg, Ca, and Ba.

7. The method as recited in claim 1, wherein said drawn bundle is heated at a temperature of about 700° to 1,100° C. for about 1 to 300 hours.

8. The method as recited in claim 1, wherein said A-B-C-D system superconductor has the formula:

$A_xB_yCu_zO_{9-\delta}$ wherein A is Y, x is 1, B is Ba, y is 2, z is 3 and $2<\delta<3$.

9. A method of producing a superconducting coil, comprising an A-B-C-D system superconductor, wherein A is one or more elements selected from the group consisting of Sr, Mg, Ca and Ba; B is one or more elements selected from the group consisting of Sc, Y, La, Ce, Pr, Nd, Pm, Sm, Eu, Gd, Tb, Dy, Ho, Er, Tm, Yb and Lu; C is copper and D is oxygen, which method comprises:

(a) selecting a plurality of copper alloy filaments, such that a superconductor is formed upon subsequent heat treatment, from the group consisting of:

(i) a copper alloy filament including at least one A element, and a copper alloy filament including at least one B element;

(ii) a copper alloy filament including both elements A and B;

(iii) a first copper alloy filament having particles of a copper oxide dispersed therein;

(iv) a second copper alloy filament coated with an oxide layer;

(v) a copper alloy filament containing at least one A element and having particles of a copper oxide dispersed therein;

(vi) a copper alloy filament containing at least one B element and having particles of a copper oxide dispersed therein;

(vii) a third copper alloy filament containing an A element and being coated with an oxide layer; and (viii) a fourth copper alloy filament containing a B element and being coated with an oxide layer; the first to fourth copper alloy filaments being substantially free of any component which adversely effects the production of the superconductor;

(b) placing the selected filaments in a groove, formed in one face of a metallic disc, to forming a filaments bundle so that the superconductor is produced in a subsequent heat treatment;

(c) rolling the disc with the filaments bundle for jointing together; and (d) heating the rolled filaments bundle under an oxidizing atmosphere for producing the superconductor.

10. The method as recited in claim 9, wherein the groove of the disc has a spiral shape whereby a superconducting coil is produced by the heating step.

11. The method as recited in claim 9, wherein said A-B-C-D system superconductor has the formula:

$(La_{2-x}M_x)CuO_4$ wherein $0<x<0.3$, and M is selected from the group consisting of Sr, Mg, Ca, and Ba.

12. The method as recited in claim 9, wherein said drawn bundle is heated at a temperature of about 700° to 1,100° C. for about 1 to 300 hours.

13. The method as recited in claim 9, wherein said A-B-C-D system superconductor has the formula:

$A_xB_yCu_zO_{9-\delta}$ wherein A is Y, x is 1, B is Ba, y is 2, z is 3 and $2<\delta<3$.

* * * * *